(12) United States Patent
Nuttall et al.

(10) Patent No.: US 6,368,919 B2
(45) Date of Patent: *Apr. 9, 2002

(54) METHOD AND COMPOSITE FOR DECREASING CHARGE LEAKAGE

(75) Inventors: Michael Nuttall; Garry A. Mercaldi, both of Meridian, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/233,313

(22) Filed: Jan. 19, 1999

(51) Int. Cl.$^7$ ............................................. H01L 21/336
(52) U.S. Cl. .................. 438/261; 438/761; 438/762; 438/763; 438/787; 438/791; 438/954
(58) Field of Search ................................ 438/954, 261, 438/265, 761, 762, 763, 787, 791

(56) References Cited

U.S. PATENT DOCUMENTS

| | | | | |
|---|---|---|---|---|
| 4,395,438 A | * | 7/1983 | Chiang | 427/94 |
| 5,504,021 A | * | 4/1996 | Hong et al. | 437/42 |
| 5,583,070 A | * | 12/1996 | Liao et al. | 437/52 |
| 5,686,748 A | | 11/1997 | Thakur et al. | 257/310 |
| 5,712,186 A | | 1/1998 | Thakur et al. | 437/69 |
| 5,756,390 A | | 5/1998 | Juengling et al. | 438/439 |
| 5,781,031 A | * | 7/1998 | Bertin et al. | 326/39 |
| 5,831,282 A | | 11/1998 | Nuttall | 257/64 |
| 5,926,739 A | * | 7/1999 | Rolfson et al. | 438/763 |
| 5,969,383 A | * | 10/1999 | Chang et al. | 257/316 |
| 5,981,404 A | * | 11/1999 | Sheng et al. | 438/791 |
| 6,017,791 A | * | 1/2000 | Wang et al. | 438/253 |
| 6,051,511 A | * | 4/2000 | Thakur et al. | 438/791 |
| 6,074,917 A | * | 6/2000 | Chang et al. | 438/261 |
| 6,117,730 A | * | 9/2000 | Komori et al. | 438/258 |

FOREIGN PATENT DOCUMENTS

KR 9505267 B1 * 5/1995 ......... H01L/21/318

* cited by examiner

*Primary Examiner*—Eddie Lee
*Assistant Examiner*—N. Drew Richards
(74) *Attorney, Agent, or Firm*—Schwegman, Lundberg, Woessner & Kluth, P.A.

(57) ABSTRACT

A dielectric insulating composite for insulating a floating gate from a control gate in a non-volatile memory is described. A material, such as an undoped polysilicon, amorphous silicon, or amorphous polysilicon or a silicon rich nitride, is inserted in the gate structure. The oxide film that results from the oxidation of these films is relatively free from impurities. As a result, charge leakage between the floating gate and control gate is reduced.

24 Claims, 3 Drawing Sheets

METHOD AND COMPOSITE FOR DECREASING CHARGE LEAKAGE

FIELD OF THE INVENTION

This invention relates to the field of semiconductor memories, and more particularly to a method and manufacture for decreasing charge leakage in a non-volatile semiconductor memory.

BACKGROUND OF THE INVENTION

The demand for inexpensive, easily accessible and compact long term information storage systems continues to increase. In the past, the demand for long term information storage was met by archiving paper records. Today, however, the volume of information requiring storage makes this solution impractical. Recently, the demand for long term information storage has been met by magnetic media information storage systems and optical information storage systems. Although these systems have excellent long term information retention capability, in some applications they are not sufficiently compact. So, a current trend is to use non-volatile semiconductor memory for long term information storage.

Non-volatile semiconductor memory is compact and permits rapid access to the stored information. Information is stored in a non-volatile semiconductor memory as electronic charge. The magnitude of the electronic charge is used to represent a binary value. For instance, in some memory systems the presence of charge represents a binary one, and the absence of charge represents a binary zero. In other memory systems, a larger charge magnitude represents a binary one, and a smaller charge magnitude represents a binary zero. In either system, charge isolation is critical to successful long term information storage.

Charge isolation implies that once an electronic charge is located in a structure, the charge remains at that location indefinitely. In the art, charge is located in a structure such as a transistor having a control gate, a floating gate, a drain, a source, and a dielectric composite insulator interposed between the control gate and the floating gate. In operation, the control gate induces an electronic charge to locate at the floating gate. Once the charge is induced at the floating gate, for the transistor device to successfully operate as a long term information storage device, the charge must remain at the floating gate for a long period of time. As devices are scaled to create higher density memory, the thickness of the dielectric is reduced to maintain the same coupling. As the thickness is reduced, the ability to prevent electron migration through the insulator becomes difficult. The rate of this charge leakage defines the time that a non-volatile semiconductor memory can function as a long term information storage device.

To successfully substitute for magnetic or optical storage devices as a long term information storage device, a non-volatile semiconductor memory device, such as an EPROM, EEPROM, or a flash EPROM, must store information reliably for at least ten years, so any charge leakage from the floating gate is detrimental to the use of non-volatile semiconductor memory as a long term information storage device.

For these and other reasons there is a need for the present invention.

SUMMARY OF THE INVENTION

The above mentioned problems with charge leakage in memory cells and other problems are addressed by the present invention and will be understood by reading and studying the following specification. A method and composite for decreasing charge leakage is described.

The dielectric composite insulator of the present invention, by reducing the charge leakage from the floating gate to the control gate of a memory cell, provides for an improved non-volatile semiconductor memory cell. Reducing the charge leakage in a non-volatile semiconductor memory makes the memory a more viable long term information storage device.

A non-volatile semiconductor memory cell includes a semiconductor substrate, a source and drain formed on the semiconductor substrate, an insulator formed on the source and drain, a floating gate formed on the insulator, a composite formed on the floating gate and a control gate formed on the composite.

In one embodiment of the present invention, a layer of undoped polysilicon, amorphous silicon, or amorphous polysilicon is located between the floating gate and the layer of silicon dioxide. In an alternate embodiment of the present invention, a layer of silicon rich nitride is deposited on the layer of silicon nitride and then oxidized to form the silicon dioxide layer. In still another embodiment of the present invention, a layer of undoped polysilicon, amorphous silicon, or amorphous polysilicon is located between the floating gate and the silicon dioxide, and a layer of silicon rich nitride is located between the layer of silicon nitride and the silicon dioxide of the composite. The effect of interposing a layer of undoped polysilicon, amorphous silicon, or amorphous polysilicon, which in some designs is thin, or a layer of silicon rich nitride, which in some designs is thin, or both into the composite is to decrease the charge leakage from the floating gate to the control gate of the memory cell. A thin layer of undoped polysilicon, amorphous silicon, or amorphous polysilicon is a layer having a thickness of less than about one-hundred angstroms, and a thin layer of silicon rich nitride is a layer having a thickness of less than about one-hundred angstroms.

Another embodiment of the present invention also includes a process for forming the dielectric insulating composite. In the art, the process for forming the composite comprises depositing a layer of silicon dioxide on the floating gate, depositing a layer of silicon nitride on the layer of silicon dioxide, and depositing a layer of silicon dioxide on the layer of silicon nitride. In the present invention, the process for forming the dielectric insulating composite comprises, in addition to the steps of the process for forming the composite, the steps of either depositing a layer of undoped polysilicon, amorphous silicon, or amorphous polysilicon or depositing a layer of silicon rich nitride, or both. In addition, in one embodiment of the process, after forming the floating gate by flowing silane and phosphine, the deposition of the layer of undoped polysilicon, amorphous silicon, or amorphous polysilicon is accomplished by reducing the flow of phosphine. In an alternate embodiment of the process, after depositing a layer of silicon nitride formed on the layer of silicon dioxide by flowing dichlorosilane and ammonia, the deposition of the silicon rich nitride layer is accomplished by reducing the flow of ammonia. And in still another embodiment, after depositing the layer of silicon nitride formed on the layer of silicon dioxide by flowing tetrachlorosilane and ammonia, the deposition of the silicon rich nitride layer is accomplished by reducing the flow of ammonia.

DETAILED DESCRIPTION OF THE INVENTION

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
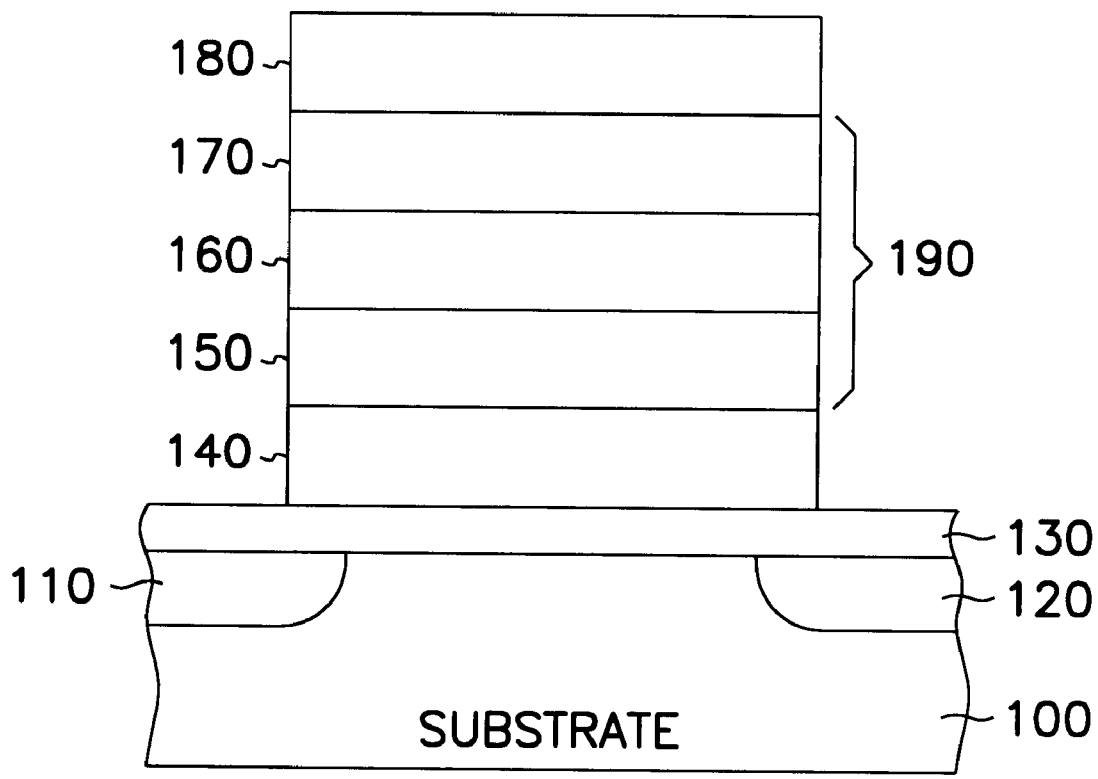
FIG. 1 is a block diagram of a composite incorporated in a prior art memory cell.

In one embodiment of the present invention a composite acts as a dielectric in a memory cell of a non-volatile semiconductor memory. Referring to FIG. 1, a block diagram of a prior art memory cell for use in a non-volatile semiconductor memory is shown. The cell is a transistor comprising a semiconductor substrate 100, a source 110, a drain 120, an insulating layer 130, a floating gate 140, a layer of silicon dioxide 150, a layer of silicon nitride 160, a second layer of silicon dioxide 170, and a control gate 180. Together, the layer of silicon dioxide 150, the layer of silicon nitride 160, and the second layer of silicon dioxide 170 make up a composite 190 that acts as a dielectric and as an insulator between the control gate 180 and the floating gate 140. The layer of nitride 160 functions as a dielectric, and the silicon dioxide layers, the layer of silicon dioxide 150 and the second layer of silicon dioxide 170, function as insulators.

In operation, a voltage at the control gate 180 induces a charge at the floating gate 140. The charge represents stored information. A charge at the floating gate 140 is prevented from migrating or leaking into the semiconductor substrate 100 by the insulating layer 130. However, as the composite 190 is reduced in thickness, it becomes a leakage path compared to insulating layer 130, and charge leaks from the floating gate 140 to the control gate 180. This leakage is admittedly small, but over time, as charge leaks from the floating gate 140, the information stored at the floating gate 140 is lost. It is this leakage that limits the performance of prior art memory cells.

The process for forming the prior art composite 190 requires partially oxidizing the doped polysilicon of the floating gate 140 to form the layer of silicon dioxide 150, depositing a layer of silicon nitride 160 by chemical vapor deposition on the layer of silicon dioxide 150, and partially oxidizing the layer of silicon nitride 160, under aggressive oxidation conditions, to form the second layer of silicon dioxide 170. Oxidizing the doped polysilicon layer consumes the whole layer, while partially oxidizing the doped polysilicon layer consumes less than the whole layer. At the completion of this process, the layer of silicon dioxide 150 contains phosphorous from the doped polysilicon, and the second layer of silicon dioxide 170 contains nitrogen from the layer of silicon nitride 160. The phosphorous and nitrogen are impurities that cause significant charge leakage through the silicon dioxide layers, when compared to the charge leakage exhibited by silicon dioxide layers free of phosphorous and nitrogen.

Figure 2:
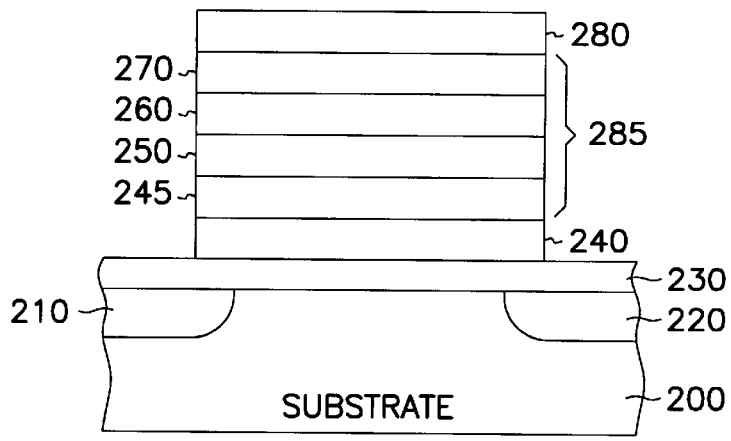
FIG. 2 is a block diagram of one embodiment of the composite of the present invention incorporated in a memory cell showing a layer of undoped polysilicon, amorphous silicon, or amorphous polysilicon added to the prior art memory cell.

Referring to FIG. 2, a diagram of one embodiment of a memory cell for use in a non-volatile semiconductor memory is shown. The cell is a transistor comprising a semiconductor substrate 200, a source 210, a drain 220, an insulating layer 230, a floating gate 240, a layer of undoped polysilicon, amorphous silicon, or amorphous polysilicon 245, a layer of silicon dioxide 250, a layer of silicon nitride 260, a second layer of silicon dioxide 270, and a control gate 280. Together, the layer of undoped polysilicon, amorphous silicon, or amorphous polysilicon 245, the layer of silicon dioxide 250, the layer of silicon nitride 260, and the second layer of silicon dioxide 270 make up a composite 285 that acts as a dielectric and as an insulator between the control gate 280 and the floating gate 240. The layer of nitride 260 functions as a dielectric, and the silicon dioxide layers, the layer of silicon dioxide 250 and the second layer of silicon dioxide 270, function as insulators. Amorphous polysilicon is part silicon and part polysilicon.

A structural difference between the memory cell of FIG. 1 and one embodiment of the present invention shown in FIG. 2 is an inter-layer insulator that is relatively free of impurities. In the embodiment of FIG. 2 a layer of undoped polysilicon, amorphous silicon, or amorphous polysilicon 245 is interposed between the floating gate 240 and the layer of silicon dioxide 250. The layer of silicon dioxide 250 is relatively free of impurities when the impurity level is at least an order of magnitude less than the impurity level of a silicon dioxide layer formed on a floating gate.

The process for forming the composite 285 requires flowing silane and phosphine to form the floating gate 240 in a chemical vapor deposition chamber. By decreasing the flow of phosphine, a layer of undoped polysilicon, amorphous silicon, or amorphous polysilicon 245 is formed on the floating gate 240. In one embodiment of the present invention, the flow of phosphine is reduced to zero. The rest of the process for forming the composite 285 includes oxidizing or partially oxidizing the layer of undoped polysilicon, amorphous silicon, or amorphous polysilicon 245 to form the layer of silicon dioxide 250, depositing a layer of silicon nitride 260 by chemical vapor deposition on the layer of silicon dioxide 250, and oxidizing the layer of silicon nitride 260, under aggressive oxidation conditions, to form the second layer of silicon dioxide 270. At the completion of this process, the layer of silicon dioxide 250 is relatively free of phosphorous and demonstrates a decrease in charge leakage, when compared with the prior art. By decreasing the concentration of phosphorous, the allowed energy levels or traps are decreased in the layer of silicon dioxide 250. Allowed energy levels or traps are a principal cause of charge leakage in the layer of silicon dioxide 250. This process allows adding the new layer without removing the wafer from the chemical vapor deposition chamber or adding processing steps.

Figure 3:
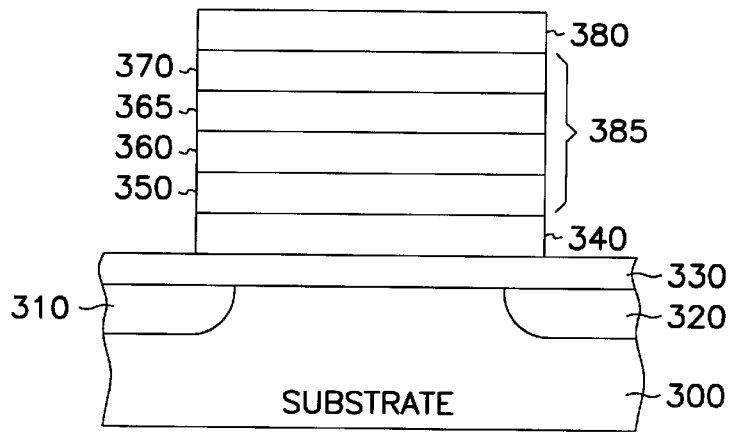
FIG. 3 is a block diagram of a second embodiment of the composite of the present invention incorporated in a memory cell showing a layer of silicon rich nitride added to the prior art memory cell.

Referring to FIG. 3, a diagram of an alternate embodiment of a memory cell for use in a non-volatile semiconductor memory is shown. The cell is a transistor comprising a semiconductor substrate 300, a source 310, a drain 320, an insulating layer 330, a floating gate 340, a layer of silicon dioxide 350, a layer of silicon nitride 360, a layer of silicon rich nitride 365, a second layer of silicon dioxide 370, and a control gate 380. Together, the layer of silicon dioxide 350, the layer of silicon nitride 360, the layer of silicon rich nitride 365, and the second layer of silicon dioxide 370 make up a composite 385 that acts as a dielectric and as an insulator between the control gate 380 and the floating gate 340. The layer of nitride 360 functions as a dielectric, and the silicon dioxide layers, the layer of silicon dioxide 350 and the second layer of silicon dioxide 370, function as insulators.

A structural difference between the memory cell of FIG. 1 and a second embodiment of the present invention shown in FIG. 3 is an inter-layer insulator that is relatively free of impurities. In the embodiment of FIG. 3 a layer of silicon rich nitride 365 is interposed between the layer of silicon nitride 360 and the layer of silicon dioxide 370. The layer of silicon dioxide 370 is relatively free of impurities when the impurity level is at least an order of magnitude less than the impurity level of a silicon dioxide layer formed on a layer of silicon nitride.

The process for forming the composite 385 requires partially oxidizing the doped polysilicon of the floating gate 340 to form the layer of silicon dioxide 350 and depositing a layer of silicon nitride 360 by chemical vapor deposition on the layer of silicon dioxide 350. As the layer of silicon nitride 360 is formed by flowing dichlorosilane and ammnonia or tetrachlorosilane and ammonia, the layer of silicon rich nitride 365 is formed by reducing the flow of ammonia. In one embodiment, the flow of ammonia is reduced to zero. After forming the layer of silicon rich nitride 365, the second layer of silicon dioxide 370 is formed by oxidizing the layer of silicon rich nitride 365. At the completion of this process, the second layer of silicon dioxide 370 is relatively free of nitrogen and demonstrates a decrease in charge leakage, when compared with the prior art. By decreasing the concentration of nitrogen, the allowed energy levels or traps are decreased in the second layer of silicon dioxide 370, and the less aggressive oxidizing conditions are required to achieve the same silicon dioxide thickness.

Figure 4:
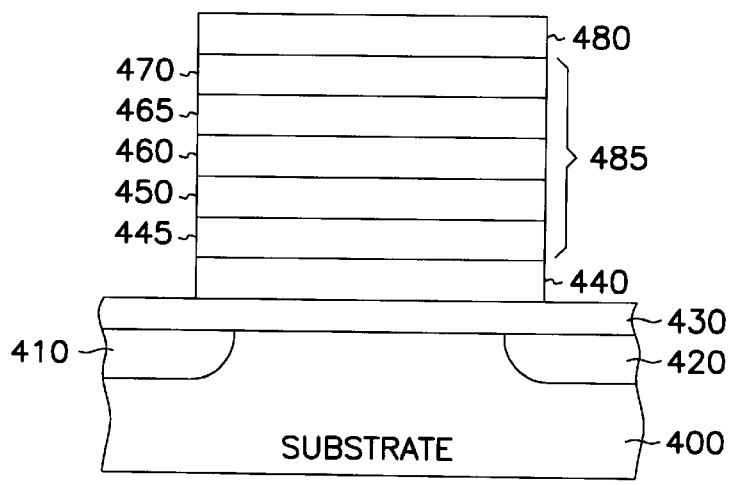
FIG. 4 is a block diagram of a third embodiment of the composite of the present invention incorporated in a memory cell showing a layer of undoped polysilicon, amorphous silicon, or amorphous polysilicon and a layer of silicon rich nitride added to the prior art memory cell.

Referring to FIG. 4, a diagram of still another embodiment of a memory cell for use in a non-volatile semiconductor memory is shown. The cell is a transistor comprising a semiconductor substrate 400, a source 410, a drain 420, an insulating layer 430, a floating gate 440, a layer of undoped polysilicon, amorphous silicon, or amorphous polysilicon 445, a layer of silicon dioxide 450, a layer of silicon nitride 460, a layer of silicon rich nitride 465, a second layer of silicon dioxide 470, and a control gate 480. Together, the layer of undoped polysilicon, amorphous silicon, or amorphous polysilicon 445, the layer of silicon dioxide 450, the layer of silicon nitride 460, the layer of silicon rich nitride 465, and the second layer of silicon dioxide 470 make up a composite 485 that acts as a dielectric and as an insulator between the control gate 480 and the floating gate 440. The layer of nitride 460 functions as a dielectric, and the silicon dioxide layers, the layer of silicon dioxide 450 and the second layer of silicon dioxide 470, function as insulators.

Referring to FIG. 4, the third embodiment is a combination of the first embodiment and the second embodiment. A structural difference between the memory cell of FIG. 1 and the memory cell of FIG. 4 is a layer of undoped polysilicon, amorphous silicon, or amorphous polysilicon 445 interposed between the floating gate 440 and the layer of silicon dioxide 450 and a layer of silicon rich nitride 465 interposed between the layer of silicon nitride 460 and the second layer of silicon dioxide 470. The purpose of the layer of undoped polysilicon, amorphous silicon, or amorphous polysilicon 445 and the layer of silicon rich nitride 465 is to decrease the charge leakage between the floating gate 440 and the control gate 480. As described in the first embodiment and the second embodiment, the layer of silicon dioxide 450 formed on the layer of undoped polysilicon, amorphous silicon, or amorphous polysilicon 445 contains less phosphorous than the corresponding layer in the prior art, and the layer of silicon rich nitride 465 formed on the layer of silicon nitride 460 contains less nitrogen than the corresponding layer in the prior art. So, the benefit of first embodiment, reducing charge leakage in the layer of silicon dioxide 450, and the benefit of the second embodiment, reducing charge leakage in the second layer of silicon dioxide 470, accrue to the third embodiment.

The process for forming the composite 485 combines the processes for forming the first embodiment and the second embodiment. The floating gate 440 is formed by flowing silane and phosphine. By decreasing the flow of phosphine, a layer of undoped polysilicon, amorphous silicon, or amorphous polysilicon 445 is formed on the floating gate 440. Oxidizing or partially oxidizing the layer of undoped polysilicon, amorphous silicon, or amorphous polysilicon 445 forms the layer of silicon dioxide 450, and the layer of silicon nitride 460 is formed by chemical vapor deposition on the layer of silicon dioxide 450. After the layer of silicon nitride 460 is formed by flowing dichlorosilane and ammonia or tetrachlorosilane and ammonia, the layer of silicon rich nitride 465 is formed by reducing the flow of ammonia. After forming the layer of silicon rich nitride 465, the second layer of silicon dioxide 470 is formed by oxidizing the layer of silicon rich nitride 465. At the completion of this process, the layer of silicon dioxide is relatively free of phosphorous and the layer of silicon rich nitride is relatively free of nitrogen, when compared with the prior art. The result is a composite that exhibits low charge leakage, when compared with the prior art.

Figure 5:
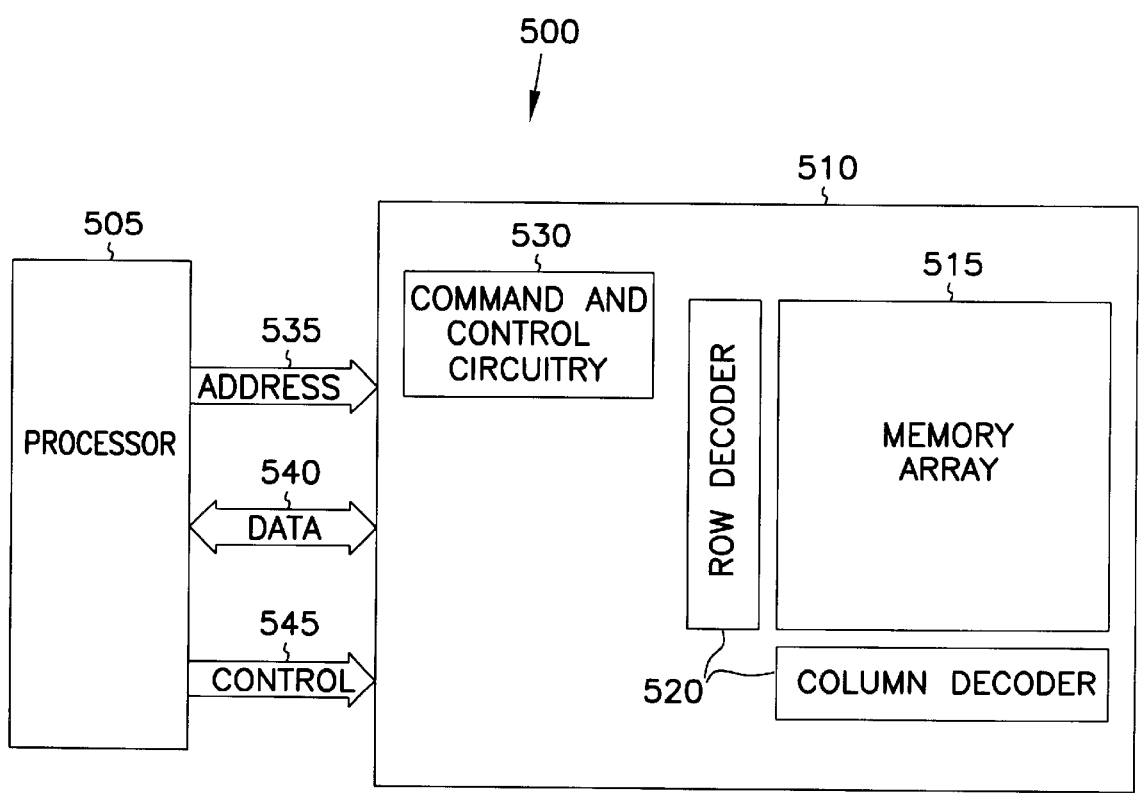
FIG. 5 is a block diagram of a system incorporating an embodiment of present invention.

Referring to FIG. 5, a block diagram of a system level embodiment of the present invention is shown. System 500 comprises processor 505 and memory device 510, which includes memory cells of one or more of the types described above in conjunction with FIGS. 2–4. Memory device 510 comprises memory array 515, address circuitry 520, and read circuitry 530, and is coupled to processor 505 by address bus 535, data bus 540, and control bus 545. Processor 505, through address bus 535, data bus 540, and control bus 545 communicates with memory device 510. In a read operation initiated by processor 505, address information, data information, and control information are provided to memory device 510 through busses 535, 540, and 545. This information is decoded by addressing circuitry 520, including a row decoder and a column decoder, and read circuitry 530. Successful completion of the read operation results in information from memory array 515 being communicated to processor 505 over data bus 540.

CONCLUSION

An embodiment of a nonvolatile memory cell has been described which has a undoped polysilicon, amorphous silicon, or amorphous polysilicon layer and a silicon rich nitride layer. This embodiment exhibits low charge leakage. A system embodiment of the invention has also been described.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A process for forming a dielectric composite for insulating a floating gate from a control gate, the process comprising:

forming a layer of undoped polysilicon on the floating gate;

forming a layer of silicon dioxide by partially oxidizing the layer of undoped polysilicon;

depositing a layer of silicon nitride on the layer of silicon dioxide;

depositing a layer of silicon rich nitride on the layer of silicon nitride; and forming a second layer of silicon dioxide by oxidizing the layer of silicon rich nitride, the control gate formed on the second layer of silicon dioxide.

2. The process of claim 1, wherein depositing a layer of silicon rich nitride results in a thin layer of silicon rich nitride.

3. The process of claim 1, wherein after depositing a layer of silicon nitride formed on the layer of silicon dioxide by flowing dichlorosilane and ammonia, the deposition of the silicon rich nitride layer is accomplished by reducing the flow of ammonia.

4. The process of claim 3, wherein, the flow of ammonia is reduced to zero.

5. The process of claim 1, wherein after depositing a layer of silicon nitride formed on the layer of silicon dioxide by flowing tetrachlorosilane and ammonia, the deposition of the silicon rich nitride layer is accomplished by reducing the flow of ammona.

6. The process of claim 5, wherein the flow of ammonia is reduced to zero.

7. A process for forming a dielectric composite for insulating a floating gate from a control gate, the process comprising:

forming a layer of undoped polysilicon on the floating gate;

forming a layer of silicon dioxide by partially oxidizing the layer of undoped polysilicon;

depositing a layer of silicon nitride on the layer of silicon dioxide;

depositing a layer of silicon rich nitride by chemical vapor deposition on the layer of silicon nitride; and forming a second layer of silicon dioxide by oxidizing the layer of silicon rich nitride, the control gate formed on the second layer of silicon dioxide.

8. The process of claim 7, wherein after depositing a layer of silicon nitride formed on the layer of silicon dioxide by flowing dichlorosilane and ammonia, the deposition of the silicon rich nitride layer is accomplished by reducing the flow of ammonia.

9. The process of claim 7, herein after depositing a layer of silicon nitride formed on the layer of silicon dioxide by flowing tetrachlorosilane and ammnonia, the deposition of the silicon rich nitride layer is accomplished by reducing the flow of ammonia.

10. A process for forming a dielectric composite for insulating a floating gate from a control gate, the process comprising:

forming a layer of amorphous silicon on the floating gate;

forming a layer of silicon dioxide by partially oxidizing the layer of amorphous silicon;

depositing a layer of silicon nitride on the layer of silicon dioxide;

depositing a layer of silicon rich nitride on the layer of silicon nitride; and forming a second layer of silicon dioxide by oxidizing the layer of silicon rich nitride, the control gate formed on the second layer of silicon dioxide.

11. The process of claim 10, wherein after depositing a layer of silicon nitride formed on the layer of silicon dioxide by flowing dichlorosilane and ammonia, the deposition of the silicon rich nitride layer is accomplished by reducing the flow of ammonia.

12. The process of claim 10, herein after depositing a layer of silicon nitride formed on the layer of silicon dioxide by flowing tetrachlorosilane and ammonia, the deposition of the silicon rich nitride layer is accomplished by reducing the flow of ammonia.

13. A process for forming a dielectric composite for insulating a floating gate from a control gate, the process comprising:

forming a layer of undoped polysilicon on the floating gate;

forming a layer of silicon dioxide by partially oxidizing the layer of undoped polysilicon;

depositing a layer of silicon nitride on the layer of silicon dioxide;

depositing a layer of silicon rich nitride on the layer of silicon nitride; and forming a second layer of silicon dioxide that is relatively free of nitrogen by oxidizing the layer of silicon rich nitride, the control gate formed on the second layer of silicon dioxide.

14. The process of claim 13, wherein after depositing a layer of silicon nitride formed on the layer of silicon dioxide by flowing dichlorosilane and ammonia, the deposition of the silicon rich nitride layer is accomplished by reducing the flow of ammonia.

15. The process of claim 13, herein after depositing a layer of silicon nitride formed on the layer of silicon dioxide by flowing tetrachlorosilane and ammonia, the deposition of the silicon rich nitride layer is accomplished by reducing the flow of ammonia.

16. A process for forming a dielectric composite for insulating a floating gate from a control gate, the process comprising:

forming a layer of undoped polysilicon on the floating gate;

forming a layer of silicon dioxide by partially oxidizing the layer of undoped polysilicon;

depositing a layer of silicon nitride on the layer of silicon dioxide;

depositing a layer of silicon rich nitride on the layer of silicon nitride; and forming a second layer of silicon dioxide that is relatively free of nitrogen from the layer of silicon rich nitride, the control gate formed on the second layer of silicon dioxide.

17. The process of claim 16, wherein after depositing a layer of silicon nitride formed on the layer of silicon dioxide by flowing dichlorosilane and ammonia, the deposition of the silicon rich nitride layer is accomplished by reducing the flow of ammonia.

18. The process of claim 16, herein after depositing a layer of silicon nitride formed on the layer of silicon dioxide by flowing tetrachlorosilane and ammonia, the deposition of the silicon rich nitride layer is accomplished by reducing the flow of ammonia.

19. A process for forming a dielectric composite for insulating a floating gate from a control gate, the process comprising:

forming a layer of amorphous polysilicon on the floating gate;

forming a layer of silicon dioxide by partially oxidizing the layer of amorphous polysilicon;

depositing a layer of silicon nitride on the layer of silicon dioxide;

depositing a layer of silicon rich nitride by chemical vapor deposition on the layer of silicon nitride; and forming a second layer of silicon dioxide by oxidizing the layer of silicon rich nitride, the control gate formed on the second layer of silicon dioxide.

20. The process of claim 19, wherein after depositing a layer of silicon nitride formed on the layer of silicon dioxide by flowing dichlorosilane and ammonia, the deposition of the silicon rich nitride layer is accomplished by reducing the flow of ammonia.

21. The process of claim 19, herein after depositing a layer of silicon nitride formed on the layer of silicon dioxide by flowing tetrachlorosilane and ammonia, the deposition of the silicon rich nitride layer is accomplished by reducing the flow of ammonia.

22. A process for forming a dielectric composite for insulating a floating gate from a control gate, the process comprising:

forming a layer of undoped polysilicon on the floating gate;

forming a layer of silicon dioxide by partially oxidizing the layer of undoped polysilicon;

depositing a layer of silicon nitride on the layer of silicon dioxide;

depositing a layer of silicon rich nitride by chemical vapor deposition on the layer of silicon nitride; and forming a second layer of silicon dioxide that is relatively free of nitrogen by oxidizing the layer of silicon rich nitride, the control gate formed on the second layer of silicon dioxide.

23. The process of claim 22, wherein after depositing a layer of silicon nitride formed on the layer of silicon dioxide by flowing dichlorosilane and ammonia, the deposition of the silicon rich nitride layer is accomplished by reducing the flow of ammonia.

24. The process of claim 22, herein after depositing a layer of silicon nitride formed on the layer of silicon dioxide by flowing tetrachlorosilane and ammonia, the deposition of the silicon rich nitride layer is accomplished by reducing the flow of ammonia.

* * * * *